(12) United States Patent
Ishikawa et al.

(10) Patent No.: US 10,283,401 B2
(45) Date of Patent: May 7, 2019

(54) BONDED SEMICONDUCTOR WAFER AND METHOD FOR MANUFACTURING BONDED SEMICONDUCTOR WAFER

(71) Applicant: SHIN-ETSU HANDOTAI CO., LTD., Tokyo (JP)

(72) Inventors: Osamu Ishikawa, Takasaki (JP); Masahiro Kato, Takasaki (JP)

(73) Assignee: SHIN-ETSU HANDOTAI CO., LTD., Tokyo (JP)

(*) Notice: Subject to any disclaimer, the term of this patent is extended or adjusted under 35 U.S.C. 154(b) by 93 days.

(21) Appl. No.: 15/553,008

(22) PCT Filed: Feb. 5, 2016

(86) PCT No.: PCT/JP2016/000594
§ 371 (c)(1),
(2) Date: Aug. 23, 2017

(87) PCT Pub. No.: WO2016/143252
PCT Pub. Date: Sep. 15, 2016

(65) Prior Publication Data
US 2018/0033681 A1    Feb. 1, 2018

(30) Foreign Application Priority Data

Mar. 6, 2015   (JP) ................................. 2015-045284

(51) Int. Cl.
*H01L 21/00*       (2006.01)
*H01L 21/762*      (2006.01)
(Continued)

(52) U.S. Cl.
CPC .. *H01L 21/76254* (2013.01); *H01L 21/26506* (2013.01); *H01L 21/3226* (2013.01);
(Continued)

(58) Field of Classification Search
None
See application file for complete search history.

(56) References Cited

U.S. PATENT DOCUMENTS

| 6,091,112 A * | 7/2000 | Kwon ............... H01L 21/76251 257/347 |
| 2007/0032040 A1* | 2/2007 | Lederer ............. H01L 21/76254 438/455 |

(Continued)

FOREIGN PATENT DOCUMENTS

| JP | H10-189404 A | 7/1998 |
| JP | 2007-507093 A | 3/2007 |

(Continued)

OTHER PUBLICATIONS

May 10, 2016 International Search Report issued in International Patent Application No. PCT/JP2016/000594.

*Primary Examiner* — Evren Seven
(74) *Attorney, Agent, or Firm* — Oliff PLC

(57) ABSTRACT

A bonded semiconductor wafer provided with a single crystal silicon layer on a main surface, wherein the bonded semiconductor wafer has a base wafer composed of a silicon single crystal, and the bonded semiconductor wafer has a first dielectric layer, a polycrystalline silicon layer, a second dielectric layer, and the single crystal silicon layer above the base wafer in this order, with a bonding plane lying between the polycrystalline silicon layer and the second dielectric layer; and wherein a carrier trap layer is formed between the base wafer and the dielectric layer. This provides a bonded semiconductor wafer of a trap-rich type SOI substrate wherein the base wafer can be prevented from lowering the specific resistance due to impurities and influence of electric charge in the BOX oxide film, distortion of radio-frequency (Continued)

fundamental signals and crosstalk signals from one circuit to another circuit are decreased, and the mass-productivity is excellent.

12 Claims, 4 Drawing Sheets

(51) Int. Cl.
*H01L 27/12* (2006.01)
*H01L 21/265* (2006.01)
*H01L 23/00* (2006.01)
*H01L 21/322* (2006.01)

(52) U.S. Cl.
CPC .............. *H01L 24/29* (2013.01); *H01L 24/83* (2013.01); *H01L 27/12* (2013.01); *H01L 2224/29193* (2013.01); *H01L 2224/83031* (2013.01); *H01L 2224/83896* (2013.01); *H01L 2924/01014* (2013.01)

(56) References Cited

U.S. PATENT DOCUMENTS

| | | | | |
|---|---|---|---|---|
| 2007/0277728 | A1* | 12/2007 | Sadaka | C30B 25/02 117/43 |
| 2012/0161310 | A1* | 6/2012 | Brindle | H01L 21/84 257/734 |
| 2013/0037922 | A1* | 2/2013 | Arriagada | H01L 21/2007 257/652 |
| 2014/0084290 | A1* | 3/2014 | Allibert | H01L 21/76254 438/479 |
| 2015/0004778 | A1* | 1/2015 | Botula | H01L 21/04 438/510 |
| 2015/0115480 | A1* | 4/2015 | Peidous | H01L 21/76251 257/798 |
| 2017/0372946 | A1* | 12/2017 | Peidous | H01L 21/02488 |
| 2018/0158721 | A1* | 6/2018 | Libbert | H01L 21/02236 |

FOREIGN PATENT DOCUMENTS

| | | |
|---|---|---|
| JP | 2011-524650 A | 9/2011 |
| JP | 2014-509087 A | 4/2014 |
| WO | 2005/031842 A2 | 4/2005 |
| WO | 2010/002515 A2 | 1/2010 |
| WO | 2012/127006 A1 | 9/2012 |

\* cited by examiner

[FIG. 1]
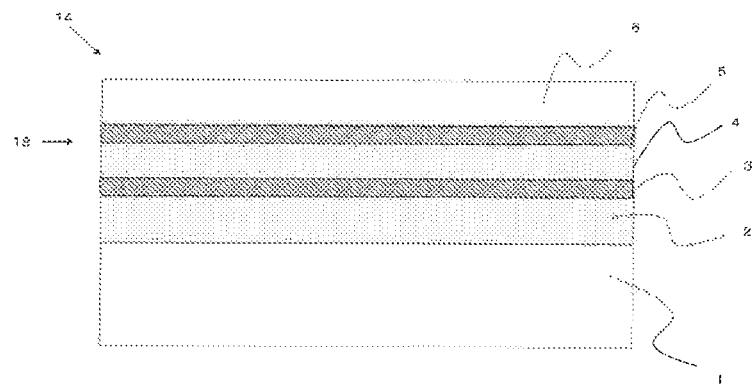
[FIG. 2]
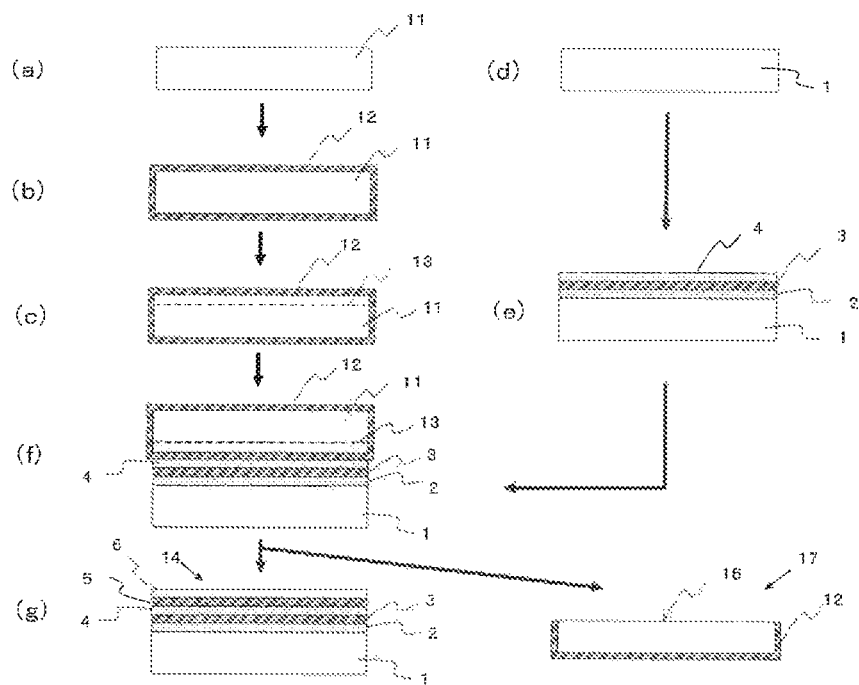
[FIG. 3]
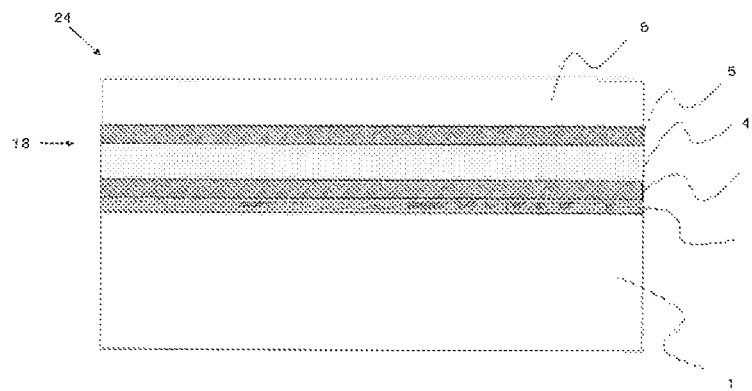

[FIG. 4]
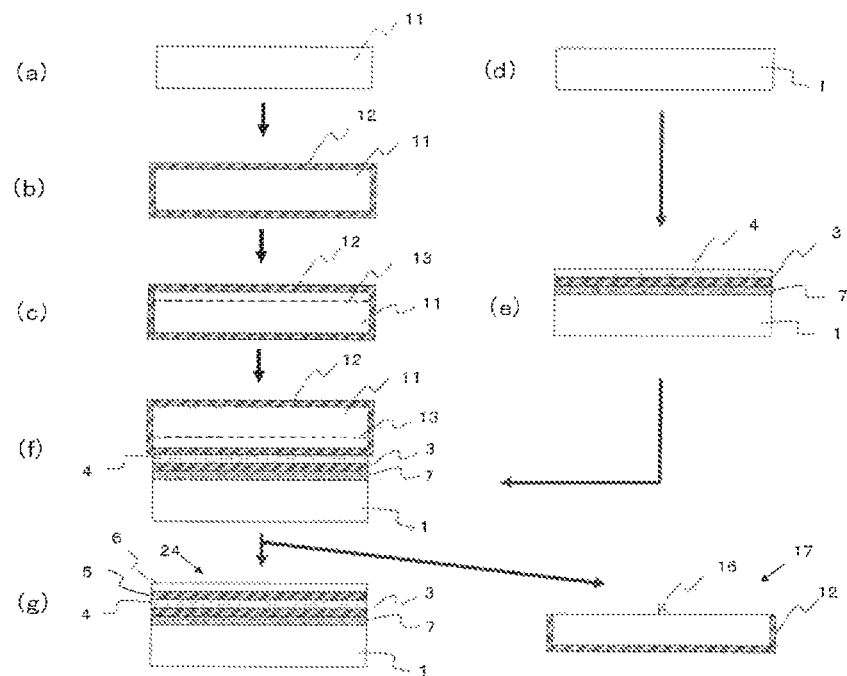
[FIG. 5]
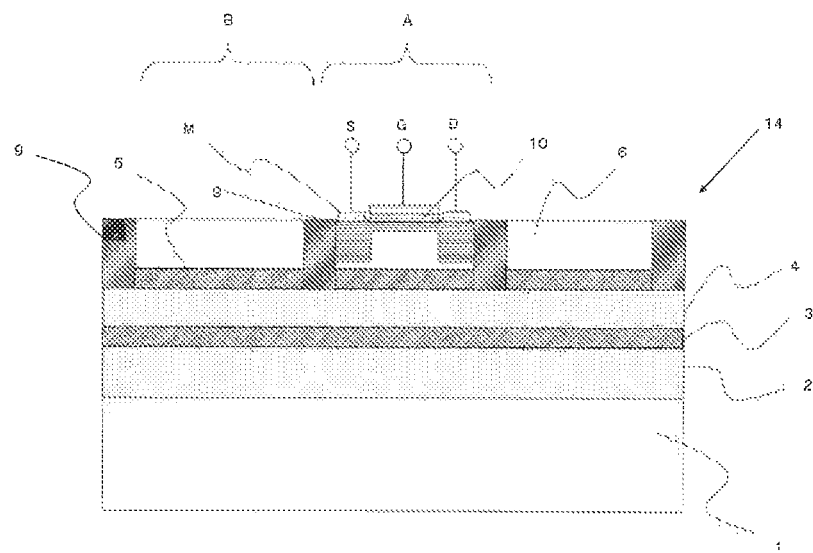

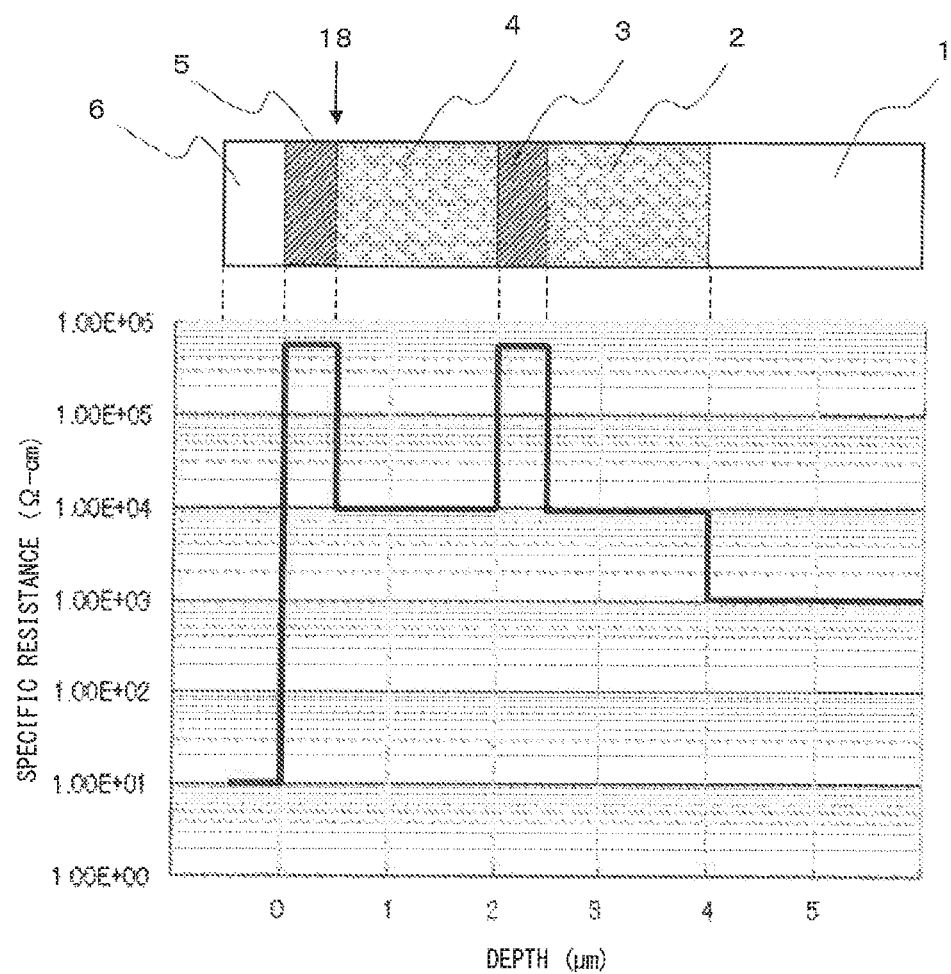

[FIG. 7]
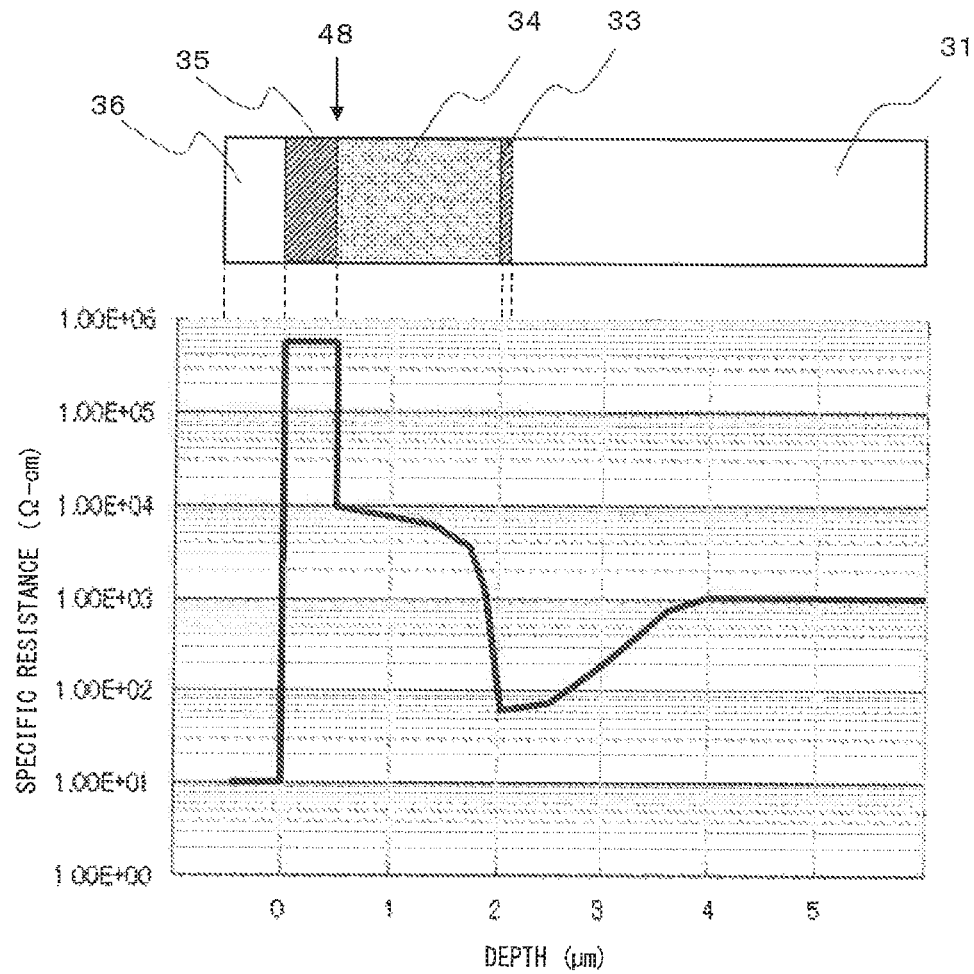
[FIG. 8]
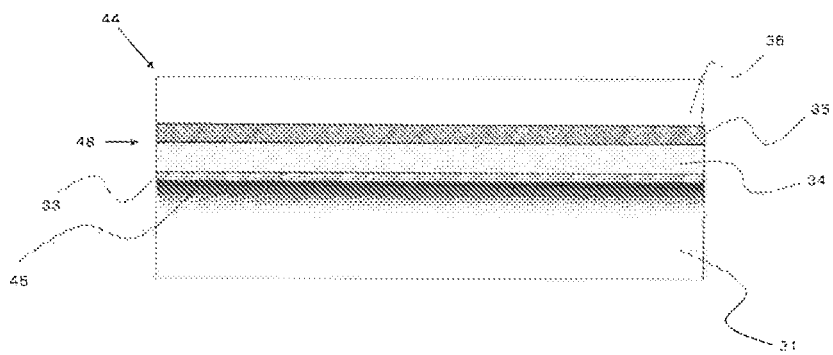

BONDED SEMICONDUCTOR WAFER AND METHOD FOR MANUFACTURING BONDED SEMICONDUCTOR WAFER

TECHNICAL FIELD

The present invention relates to a bonded semiconductor wafer for manufacturing a radio-frequency integrated circuit and a method for manufacturing a bonded semiconductor wafer.

BACKGROUND ART

Communication equipment represented by mobile phones is required to integrate communication functions that can handle various communication systems and various frequencies into the same equipment. Further improvements of the functionality and miniaturization are also demanded strongly. On one semiconductor chip, for example, a circuit is constructed such that an active element block represented by a transistor to treat signals such as digital signals and analog signals at radio-frequency is combined with a passive element represented by a resistor, a capacitor, or an inductor. In a radio-frequency integrated circuit, particularly, various levels of signals are treated including very weak signals used for reception (e.g., a signal level of about −100 dBm) and large signals for transmission (e.g., a signal level of about +10 dBm). In order to operate the integrated circuit as the circuit design, the wave form of the fundamental signals have to be less distorted, and signals treated on one circuit have to be prevented from crosstalk to another neighboring circuit or interfering with signals of the neighboring circuit mutually on the semiconductor substrate of the radio-frequency integrated circuit.

The passive elements used for radio-frequency integrated circuits, which are represented by a resistor, a capacitor, or an inductor, cannot be operated at radio-frequency unless the resistive loss component and the stray capacitance component are small, and the constructed circuit has a high Q-factor. Moreover, the loss increases to increase the power consumption, making it difficult to operate portable devices such as mobile phones for a long time with batteries. Accordingly, the resistive loss component and the stray capacitance component of the passive element have to be extremely small.

As these radio-frequency integrated circuits, so-called bonded semiconductor wafers have been put to practical use and largely used recently; in which a bonded semiconductor wafer, in other words, a so-called trap-rich type SOI (Silicon on Insulator) substrate, has a base wafer composed of a silicon single crystal, a polycrystalline silicon layer (also referred to as a trap-rich layer) on the base wafer, a dielectric layer on the polycrystalline silicon layer, and a single-crystal silicon layer on the dielectric layer. In the base wafer used for this case, distortion of the radio-frequency fundamental wave and crosstalk signals decrease as the specific resistance is higher. Accordingly, wafers of about 1 kΩ·cm to 4 kΩ·cm have been used commonly in view of mass productivity of base wafers. Herein, the decreased distortion of radio-frequency and crosstalk signal can be determined by measuring secondary harmonic wave characteristics (the ratio of component that has twice frequency of the fundamental frequency), meaning small secondary harmonic wave.

The polycrystalline silicon layer is deposited to prevent inversion of the base wafer lain thereunder. The polycrystalline silicon layer with the thickness of about 1 μm to 2 μm has been used in view of balance of physical warpage and distortion of the whole SOI substrate.

Regarding the specific resistance value of a base wafer and mass productivity thereof, as the specific resistance is lower, the impurities can be controlled easier, which enables mass production of substrates with the targeted specific resistance. In the present mass production technology of silicon single crystals, however, high specific resistance, for example, more than 4 kΩ·cm is difficult to realize since the targeting involves controlling to decrease the impurities. Under the present conditions, it becomes impossible in an extreme case to predict whether the wafer shows a value near 4 kΩ·cm or a value near 8 kΩ·cm until the wafer is actually prepared. That is, in an industrial view, the wafers are produced under extremely unstable conditions. As a result, base wafers with a high specific resistance have been produced in poor yields with very high price. This causes an increase of price of semiconductor chips for mobile phones and smart phones, which are main market of the radio-frequency integrated circuit, losing any industrial value.

If the mass production of base wafer with a high specific resistance can be realized, other large problems remain.

The first problem is a shortcoming that the specific resistance is liable to change by heat treatment due to an influence of donors formed from oxygen contained in the base wafer itself, which is caused by extremely low impurity concentrations as follows: an impurity concentration of phosphorus is about $3\times10^{12}/cm^2$ in an n-type semiconductor with the specific resistance of 1 kΩ·cm, and an impurity concentration of boron is about $1\times10^{13}/cm^2$ in a p-type semiconductor with the specific resistance of 1 kΩ·cm. It becomes possible to prevent this fluctuation of specific resistance to a certain extent by setting the oxygen concentration of a base wafer to low and adjusting the heat treatment temperature used for the semiconductor process.

The second problem is formation of a layer with a lower specific resistance by forming an inversion layer on the front face side of a base wafer with a high specific resistance due to electric charge contained in a so-called BOX oxide film (a buried oxide film) or electric charge captured on an interface level that appears on the interface between the BOX oxide film and the polycrystalline silicon layer. Such formation of the layer with a lower specific resistance promotes crosstalk of radio-frequency signals to abandon the meaning to use a base wafer with a high specific resistance. In a so-called trap-rich type SOI substrate, a polycrystalline silicon layer (a trap-rich layer) is inserted to prevent such formation of an inversion layer. However, the oxide film remains when applying insufficient temperature conditions for depositing the polycrystalline silicon layer or insufficient hydrogen treatment for removing the surface oxide film before the deposition. This causes formation of an inversion layer again, regardless of introducing the polycrystalline silicon layer, under the oxide film lying thereunder to abandon the meaning to use a base wafer with a high specific resistance.

The third problem is impurities such as phosphorus and boron that can be involved immediately under the dielectric layer, which is referred to as a so-called BOX oxide film, in a bonding step or a step of oxidation or heat treatment using an electric furnace when manufacturing a trap-rich type SOI substrate. The impurities are dispersed into the polycrystalline silicon layer and the base wafer to cause large lowering of the specific resistance of the polycrystalline silicon layer and the base wafer. Regarding this diffusion of impurities, it has been considered that the diffusion source is mainly originated from impurities contained in the air of a so-called clean room and pure water used for a semiconductor process, as well as impurities of other products that have remained in oxidation or heat treatment using the electric furnace. The measurement of the impurity concentration itself is technically difficult since the impurity concentrations are extremely low such that an impurity concentration of phosphorus is about $3\times10^{12}/cm^2$ in an n-type semiconductor with the specific resistance of 1 kΩ·cm, and an impurity concentration of boron is about $1\times10^{13}/cm^2$ in a p-type semiconductor with the specific resistance of 1 kΩ·cm. As a semiconductor substrate having a high specific resistance for radio-frequency, the base wafer are required to have a specific resistance such as 5 kΩ·cm and 10 kΩ·cm. It is almost impossible to maintain a clean room to treat such substrates and an electric furnace such that contamination of the clean room as well as re-addition of impurities in the electric furnace and diffusion of the impurities are reduced to very low levels.

In production of normal semiconductors that are not for radio-frequency, impurities contained in air of a so-called clean room and pure water used for semiconductor processing have not been considered as a problem. This is only because the semiconductors may be wafers that are required to have a specific resistance of 100 Ω·cm to 1 kΩ·cm or less, corresponding to a high impurity concentration level of about $1\times10^{14}/cm^2$, which enables normal environmental control methods for clean rooms to handle this impurity concentration of about $1\times10^{14}/cm^2$. In such clean rooms for semiconductor process to produce normal semiconductors, which are not for radio-frequency, the concentration of unexpected impurities is high. Accordingly, it has been impossible to test-manufacture or produce, for example, a trap-rich type SOI substrate for radio-frequency and an integrated circuit operated at radio-frequency using the same, each of which is required to have a higher specific resistance.

CITATION LIST

Patent Literature

Patent Document 1: Japanese Unexamined Patent Application Publication (Kohyo) No. 2014-509087

SUMMARY OF INVENTION

Problem to be Solved by the Invention

FIG. 8 shows a sectional view of a wafer produced by a conventional production method for a semiconductor-on-insulator (SOI) type substrate for a radio-frequency application field described in Patent Literature 1.

In the bonded semiconductor substrate 44 of a conventional example in FIG. 8, the base wafer 31 has a specific resistance of more than 500 Ω·cm, preferably 1 kΩ·cm to 3 kΩ·cm or more. On the base wafer 31, the dielectric thin film 33 is formed, and thereafter, the polycrystalline silicon layer 34 is formed by a method such as deposition. The dielectric thin film 33 is formed by a method such as Rapid Thermal Oxidation or dry thermal oxidation, which are different from that for a native oxide film layer. The dielectric thin film, having a density higher than that of a native oxide film and a thickness of 0.5 nm to 10 nm, functions to prevent or at least virtually retards re-crystallization of the polycrystalline silicon layer laying thereon. Generally, in a bonding method referred to as an ion implantation delamination method (the Smart Cut method (a registered trademark)), the second dielectric layer 35 and the single crystal silicon layer 36 are bonded onto the polycrystalline silicon layer 34 by bonding another wafer to complete a trap-rich type SOI substrate having the dielectric thin film 33 under the polycrystalline silicon layer 34. In FIG. 8, the bonding plane 48 is between the polycrystalline silicon layer 34 and the second dielectric layer 35.

As the second dielectric layer 35, an oxide film is used generally and also referred to as a BOX oxide film. The thickness is thicker than that of the dielectric thin film 33, and the thickness of tens of nanometers to several micrometers is used generally. In FIG. 8, the polycrystalline silicon layer 34 basically has a function to prevent inversion of conductivity type of the base wafer 31 at the side of the interface with the dielectric thin film 33 to the opposite conductivity type. Under this function, as the specific resistance of the base wafer 31 becomes higher, the distortion of radio-frequency and crosstalk signals get smaller, and the substrate becomes more suitable for operation at radio-frequency. It is important to form the dielectric thin film 33 into a thin film in such a way that the film functions as a diffusion barrier to single-crystallization of the polycrystalline silicon layer 34 and unintentional impurities to the base wafer 31, without functioning as an obstacle to pass carriers between the polycrystalline silicon layer 34 and the base wafer 31. This dielectric thin film 33 is typically less than 2 nm in thickness, which is sufficiently thin for free carriers to be permeable. As a result, the dielectric thin film 33 is prevented from disturbing the function of the polycrystalline silicon layer 34 to trap carriers circulating in the base wafer 31 thereunder.

Actually, a substrate described in the conventional example of FIG. 8 was produced to verify the effects, however, these effects were not observed at all. That is, the bonded semiconductor wafer 44 of the conventional example in FIG. 8 has the first large problem such that the film thickness of the dielectric thin film 33 is very difficult to control, thereby being uncontrollable in a required precision. When the dielectric thin film 33, which is an oxide film in many cases, was increased in thickness by 1 nm based on the prescribed thickness of 2 nm, the underneath base wafer 31 tended to form the inversion layer 45, particularly when the base wafer had a higher specific resistance. When the thickness was thinner by 1 nm than that of 2 nm, the polycrystalline silicon layer 34 generated single-crystallization, and unintentional impurities generated to diffuse into the base wafer 31. As a result, the process could not be controlled at all, failing to form devices in a good yield, and causing poor reproducibility.

The bonded semiconductor wafer 44 of the conventional example in FIG. 8 also has the second problem of very large fluctuation of the properties. The dielectric thin film 33 is very thin, thereby being influenced by a heat treatment at about 1100° C. or 1200° C. applied in a step of forming a bonded wafer or a step of forming a device. As a result, each wafer has different properties, specifically in the conditions for forming the inversion layer 45 and so on described above. This heat treatment step at high temperature changes the film thickness of the dielectric thin film 33. Accordingly, it has been unclear how much film thickness remains at the end of the device forming process in the dielectric thin film 33 formed at the beginning, or the whole of which have lost or not, even in the substrates produced by a process under the same conditions. As a result, it has been impossible to produce bonded semiconductor wafers stably, and moreover, the properties have been largely varied in the device forming process thereafter.

Since the polycrystalline silicon layer 34 is deposited on the dielectric thin film 33 in such an unstable state, the properties of the polycrystalline silicon layer 34 itself is inevitably unstable. Specifically, the polycrystalline silicon layer 34 have lacked the stability, with the variation being increased in the specific resistance or the degree of single-crystallization.

FIG. 7 shows an example of a distribution of specific resistance in a depth direction of the bonded semiconductor wafer 44 of the conventional example shown in FIG. 8. That is, FIG. 7 is a graph briefly showing how the distribution of specific resistance in a depth direction of the bonded semiconductor wafer finally changes in the bonded semiconductor wafer 44 of the conventional example shown in FIG. 8. The upper part of the graph of specific resistance shows a sectional view of the bonded semiconductor wafer of the conventional example to clearly illustrate the part where the specific resistance is changing by comparison to the structure.

In FIG. 7, the single crystal silicon layer 36 with a specific resistance of 10 Ω·cm and the base wafer 31 with a specific resistance of 1 kΩ·cm are used. The polycrystalline silicon layer 34 deposited by using an epitaxial equipment has an initial value of a specific resistance of 10 kΩ·cm. However, the specific resistance sharply drops in the polycrystalline silicon layer 34 near the base wafer 31 to a value less than 100 Ω·cm, for example, due to the very thin dielectric thin film 33, in which single-crystallization proceeds from the side of the base wafer 31, and unintentional impurities on the bonding plane 48 that are involved and diffused. As this reasons, many factors can be considered: specifically, phosphorus atoms or boron atoms, which are diffusion sources of n-type or p-type impurities, can adhere onto the wafer surface in various heat treatments by using an electric furnace; and metallic particles can adhere onto the wafer by mechanical contact as irregularly occurred phenomena, followed by various heat treatments to diffuse to the base wafer 31 not only to the polycrystalline silicon layer 34 through various heat treatments, which can decrease the specific resistance. The dielectric thin film 33 lies between the polycrystalline silicon layer 34 and the base wafer 31, but the thickness is thin, and accordingly, the diffusion barrier is easily broken by high-temperature heat treatment locally or entirely. This causes to diffuse unintentional impurities to the base wafer 31, whereby the specific resistance also decreases in the base wafer 31.

The second dielectric layer 35 shows a very high specific resistance value, which is described simply as the specific resistance of 600 kΩ·cm. This high specific resistance means that the second dielectric layer 35 functions as a barrier to diffuse impurities since the thickness is thick, which is totally different from the dielectric thin film 33 in which the diffusion barrier is broken. This is only because the dielectric thin film 33 has a halfway film thickness of 0.5 nm to 10 nm, and such a thin film cannot be a diffusion barrier influenced by high-temperature heat treatment. Existence of the dielectric thin film 33 can cause the base wafer 31 to form the inversion layer 45. Accordingly, there have not been stable conditions to form a film that functions as a diffusion barrier without acting as a barrier to pass carriers between the polycrystalline silicon layer 34 and the base wafer 31.

In the bonded semiconductor wafer 44 of the conventional example shown in FIG. 8, the distribution of specific resistance in a depth direction is such that the specific resistance of the base wafer 31 sharply drops to a value of less than 100 Ω·cm as shown in FIG. 7, for example, which increases crosstalk signals at radio-frequency not only distortion of radio-frequency to form a substrate that is totally useless in radio-frequency regions.

As described above, in the bonded semiconductor wafer 44 of the conventional example shown in FIG. 8 and FIG. 7, it was extremely difficult to produce a bonded semiconductor wafer that is suitable to a radio-frequency integrated circuit, in which distortion of radio-frequency and crosstalk signals are small, stably in a large amount at lower cost. A new bonded semiconductor wafer and the production method thereof that can solve the problem have been strongly required.

The present invention was accomplished in view of the above-described problems. It is an object of the present invention to provide a bonded semiconductor wafer of a trap-rich type SOI substrate in which the base wafer can be prevented from lowering the specific resistance due to impurities and influence of electric charge in the BOX oxide film, the distortion of radio-frequency fundamental signals and the crosstalk signals from one circuit to another circuit are decreased, and the mass-productivity is excellent; as well as the method for manufacturing such a bonded semiconductor wafer.

Means for Solving Problem

To achieve the above-described object, the present invention provides a bonded semiconductor wafer provided with a single crystal silicon layer on a main surface, wherein the bonded semiconductor wafer has a base wafer composed of a silicon single crystal, and the bonded semiconductor wafer has a first dielectric layer, a polycrystalline silicon layer, a second dielectric layer, and the single crystal silicon layer above the base wafer in this order, with a bonding plane lying between the polycrystalline silicon layer and the second dielectric layer; and wherein a carrier trap layer is formed between the base wafer and the first dielectric layer.

Having a structure in which the carrier trap layer is formed between the base wafer and the first dielectric layer as described above, the carrier trap layer traps free carriers in the base wafer, which makes it possible to prevent the base wafer from forming an inversion layer. By forming a structure in which polycrystalline silicon layer lies between the first dielectric layer and the second dielectric layer, single-crystallization of the polycrystalline silicon layer can be prevented, and diffusion of unintentional impurities into the base wafer can be prevented.

It is preferable that the carrier trap layer be a polycrystalline silicon layer deposited on the base wafer.

When the carrier trap layer is a polycrystalline silicon layer as described above, the total thickness of the polycrystalline silicon layers is thicker than that of the conventional bonded semiconductor wafer shown in FIG. 8, which makes it possible to decrease distortion of radio-frequency or crosstalk signals in a corresponding amount. As described above, it is difficult to stably perform crystal growth of a base wafer having a specific resistance of 4 kΩ·cm or more, but the polycrystalline silicon layer can realize a high specific resistance of about 10 kΩ·cm relatively easily by controlling the deposition temperature and so on with an epitaxial equipment for silicon. Having such polycrystalline silicon layers laminated in two layers with the first dielectric layer inserted therebetween, the radio-frequency integrated circuit can be improved in radio-frequency characteristic.

In this case, it is preferable that the carrier trap layer be an ion-implanted layer formed by ion implantation into the base wafer.

When the carrier trap layer is an ion-implanted layer as described above, free carriers in the base wafer are trapped by defects formed in the ion-implanted layer, and the free carriers have very short life time thereby. This can prevent the specific resistance from fluctuating in accordance with the potential without forming an inversion layer at the carrier trap layer side of the base wafer. Having one layer of the polycrystalline silicon layer, the production process can be simplified, and the flatness of the bonded semiconductor wafer can be improved.

In this case, it is preferable that the base wafer have a specific resistance of 4 kΩ·cm or less.

A base wafer with such a specific resistance can be produced relatively easily, thereby making it possible to provide a bonded semiconductor wafer with excellent radio-frequency characteristic that can be mass produced at lower cost.

To accomplish the above-described object, the present invention also provides a method for manufacturing a bonded semiconductor wafer provided with a single crystal silicon layer on a main surface, including the steps of:

preparing a base wafer composed of a silicon single crystal;

forming a first dielectric layer above the base wafer;

forming a polycrystalline silicon layer on the first dielectric layer, and polishing the surface of the polycrystalline silicon layer;

preparing a bond wafer composed of a silicon single crystal;

forming a second dielectric layer on a surface of the bond wafer;

bonding the base wafer and the bond wafer such that the polycrystalline silicon layer of the base wafer and the second dielectric layer of the bond wafer are in contact with each other; and thinning the bond wafer to form the single crystal silicon layer; and the method further including the step of forming a carrier trap layer between the base wafer and the first dielectric layer.

By forming the polycrystalline silicon layer between the first dielectric layer and the second dielectric layer as well as forming the carrier trap layer between the base wafer and the first dielectric layer, the base wafer is prevented from forming an inversion layer, and the polycrystalline silicon layer can be prevented from single-crystallization, thereby making it possible to prevent diffusion of unintentional impurities into the base wafer. By polishing the surface of the polycrystalline silicon layer, the flatness can be improved, and stable bonding can be performed. By producing bonded wafer by using the production method described above, it is possible to stably provide a bonded semiconductor wafer with excellent secondary harmonic wave characteristic in which the specific resistance scarcely changes in high-temperature heat treatment when it is used as a semiconductor substrate for a radio-frequency integrated circuit.

In this case, it is preferable that the carrier trap layer be formed by depositing the polycrystalline silicon layer on the base wafer.

By depositing the polycrystalline silicon layer as the carrier trap layer, polycrystalline silicon layers with a high specific resistance can be laminated in two layers having the first dielectric layer sandwiched therebetween, which makes it possible to reduce distortion of radio-frequency and cross-talk signals of the radio-frequency integrated circuit formed on the bonded semiconductor wafer.

In this case, it is preferable that the carrier trap layer be an ion-implanted layer and formed by ion implantation into the base wafer through the first dielectric layer.

By forming an ion-implanted layer as the carrier trap layer as described above, it is possible to prevent the specific resistance from fluctuating in accordance with the potential without forming an inversion layer in the base wafer. Having one layer of the polycrystalline silicon layer, the production process can be simplified, and the flatness of the bonded semiconductor wafer can be improved.

In this case, it is preferable that the prepared base wafer have a specific resistance of 4 kΩ·cm or less.

A base wafer with such a specific resistance can be produced relatively easily, thereby making it possible to provide a bonded semiconductor wafer with excellent radio-frequency characteristic that can be mass produced at lower cost.

Effect of Invention

As described above, in the inventive bonded semiconductor wafer in which the carrier trap layer is a polycrystalline silicon layer, the polycrystalline silicon layer can be prevented from single-crystallization and can definitely function as a diffusion barrier to unintentional impurities to the base wafer by having the first dielectric layer of 10 nm or more and several μm or less, for example. This means that the base wafer can maintain the specific resistance at a higher value near to the initial value. The carrier trap layer (the polycrystalline silicon layer) lies immediately under the first dielectric layer and functions as a trap for free carriers, bringing an effect to prevent formation of an inversion layer. Accordingly, it is possible to provide a bonded semiconductor wafer with excellent radio-frequency characteristic that can be mass-produced at lower cost with its stable properties and good yield. In the inventive method for manufacturing a bonded semiconductor wafer in which the carrier trap layer is formed by depositing the polycrystalline silicon layer on the base wafer, the surface of the polycrystalline silicon layer has good flatness by polishing to enable stable bonding. Accordingly, a bonded semiconductor wafer with excellent radio-frequency characteristic can be provided stably in a good yield.

In the inventive bonded semiconductor wafer in which the carrier trap layer is an ion-implanted layer, the ion-implanted layer that functions as a carrier trap layer lies immediately under the first dielectric layer. This functions as a trap for free carriers and bringing an effect to prevent formation of an inversion layer as the polycrystalline silicon layer described above. By inserting the polycrystalline silicon layer between the first dielectric layer and the second dielectric layer, the polycrystalline silicon layer can be prevented from single-crystallization and can definitely function as a diffusion barrier to unintentional impurities into the base wafer. Accordingly, it is possible to provide a bonded semiconductor wafer with excellent radio-frequency characteristic that can be mass-produced at low cost with its stable properties and good yield. In the inventive method for manufacturing a bonded semiconductor wafer in which an ion-implanted layer is formed in the base wafer as a carrier trap layer, the ion-implanted layer can function as a trap for free carriers instead of the polycrystalline silicon layer. By using an ion implantation for the carrier trap layer, the flatness of the base wafer can be maintained intact. Accordingly, the flatness, which is an important point to be determined in bonded semiconductor wafers, is better than that when using a polycrystalline silicon layer as the carrier trap layer, thereby making it possible to reduce the amount and time for polishing the polycrystalline silicon layer before bonding. It is also possible to provide a bonded semiconductor wafer with excellent radio-frequency characteristic that can be mass-produced at lower cost with its stable properties and good yield.

BRIEF DESCRIPTION OF DRAWINGS

FIG. 1 is a sectional view showing the bonded semiconductor wafer of Embodiment 1 according to the present invention;

FIG. 2 is a sectional process view showing the method for manufacturing a bonded semiconductor wafer of Embodiment 1 according to the present invention;

FIG. 3 is a sectional view showing the bonded semiconductor wafer of Embodiment 2 according to the present invention;

FIG. 4 is a sectional process view showing the method for manufacturing a bonded semiconductor wafer of Embodiment 2 according to the present invention;

FIG. 5 is a sectional view showing an example of a device produced by using the bonded semiconductor wafer of Embodiment 1 according to the present invention;

FIG. 6 is a diagram showing a distribution of specific resistance in a depth direction of the bonded semiconductor wafer of Embodiment 1 according to the present invention;

FIG. 7 is a diagram showing a distribution of specific resistance in a depth direction of the bonded semiconductor wafer of the conventional example;

FIG. 8 is a sectional view showing the bonded semiconductor wafer of the conventional example.

DESCRIPTION OF EMBODIMENTS

Embodiment 1

Hereinafter, the inventive bonded semiconductor wafer of Embodiment 1 will be described by reference to FIG. 1.

FIG. 1 is a sectional view showing the bonded semiconductor wafer 14 of Embodiment 1 according to the present invention. In the inventive bonded semiconductor wafer 14 of Embodiment 1, the base wafer 1 is a single crystal substrate of silicon referred to as a so-called high specific resistance substrate, having a specific resistance value of 100 $\Omega$·cm or more, preferably 500 $\Omega$·cm or more, more preferably 1 k$\Omega$·cm or more. The specific resistance value of base wafer has a feature such that when the value is about 1 k$\Omega$·cm to 4 k$\Omega$·cm, crystal pulling can be performed to target for the prescribed specific resistance value, and the high resistivity substrate can be produced in high productivity and stability at low cost. However, when the specific resistance value is 4 k$\Omega$·cm or more, it is actual that the prescribed specific resistance value may not be achieved, and the specific resistance value involves many uncertainty elements on how much value will be attained until crystal pulling is performed, and the cost is raised consequently.

On this base wafer 1, the carrier trap layer 2, the first dielectric layer 3, and the polycrystalline silicon layer 4 are formed successively. The carrier trap layer 2 is a polycrystalline silicon layer deposited on the base wafer 1. The first dielectric layer 3 can be formed by a CVD method, but may be formed by another method such as oxidizing the carrier trap layer (polycrystalline silicon layer) 2. The outermost face of the polycrystalline silicon layer 4 is polished to be good flatness by a CMP (Chemical Mechanical Polishing) method, for example, and functions as the bonding plane 18.

The second dielectric layer 5 and the single crystal silicon layer 6 are bonded and delaminated by using a so-called smart cut method, which involves bonding from another substrate (a bond wafer), to complete a trap-rich type SOI substrate.

Each thickness of the carrier trap layer (polycrystalline silicon layer) 2 and the polycrystalline silicon layer 4 may be in a typical value of about 2 μm. The carrier trap layer (polycrystalline silicon layer) 2 acts to trap free carriers in the base wafer to prevent formation of an inversion layer on the face of the base wafer 1 at the side on which the carrier trap layer 2 has been formed. The second dielectric layer 5 is over the polycrystalline silicon layer 4 and the first dielectric layer 3 is under the polycrystalline silicon layer 4. This first dielectric layer 3 functions as a diffusion barrier to prevent unintentional impurities from diffusing into the base wafer 1, and can confine impurities and so on in the interior of the polycrystalline silicon layer 4 thereby. The polycrystalline silicon layer 4, being sandwiched between the dielectric layers, does not promote single-crystallization if high-temperature heat treatment is performed. In this case, the lowering of the specific resistance due to unintentional impurities is smaller than in the case of single-crystallized. Each thickness of the first dielectric layer 3 and the second dielectric layer 5 may be a film thickness of 10 nm or more, preferably 100 nm to 400 nm. Since each of the first dielectric layer 3 and the second dielectric layer 5 is not too thin as described above, the thickness can be controlled easily, and the layers are stable without disappearing in high-temperature heat treatment. As described above, these first dielectric layer 3 and second dielectric layer 5 can be formed by CVD or thermal oxidation. It is needless to say that other dielectric material other than the oxide film (e.g., a nitride film, an oxynitride film) can bring the same effect.

In the inventive bonded semiconductor wafer of Embodiment 1 shown in FIG. 1, unintentional impurities can be involved in the bonding plane 18. This reason is specifically considered such that phosphorus atoms or boron atoms, which are diffusion sources of n-type or p-type impurities, can adhere onto the wafer surface in various heat treatments by using an electric furnace; and metallic particles can adhere onto the wafer by mechanical contact as irregularly occurring phenomena. In the present invention, the second dielectric layer 5 and the first dielectric layer 3 lie over and under the polycrystalline silicon layer 4 as described above. They can prevent abnormal diffusion of impurities and can confine these unintentional impurities in the interior of the polycrystalline silicon layer 4 even though the impurities are adhered and involved in the bonding plane 18.

The polycrystalline silicon layer 4 and the carrier trap layer (polycrystalline silicon layer) 2, each of which has a high specific resistance, lie under an active device, which is operated at radio-frequency and is formed on the single crystal silicon layer 6. Accordingly, the total thickness of the polycrystalline silicon layers is naturally thicker than that of the bonded semiconductor wafer 44 of the conventional example shown in FIG. 8, and distortion of radio-frequency and crosstalk signal are decreased for that, thereby making the substrate show excellent radio-frequency characteristic and be suitable for a radio-frequency integrated circuit. As described above, it is difficult to stably perform crystal growth of a base wafer having a specific resistance of 4 k$\Omega$·cm or more, but the polycrystalline silicon layer used for the present invention can achieve a specific resistance of about 10 kΩ·cm relatively easily by controlling the deposition temperature and so on with an epitaxial equipment for silicon. In addition to that, since the polycrystalline silicon layers are laminated in two layers inserting the first dielectric layer; it is obvious that the inventive bonded semiconductor wafer has better radio-frequency characteristic compared to that of the bonded semiconductor wafer of the conventional example shown in FIG. 8.

As described above, the structure of the inventive bonded semiconductor wafer 14 of Embodiment 1 shown in FIG. 1 is excellent in the productivity and repeatability. In addition, distortion of radio-frequency and the amount of crosstalk signals, which are important for forming a radio-frequency integrated circuit, can be largely decreased. Mass-production thereof is also possible, thereby making it possible to provide a bonded semiconductor wafer with excellent radio-frequency characteristic at low cost.

Hereinafter, the inventive method for manufacturing a bonded semiconductor wafer of Embodiment 1 will be described by reference to the sectional production process view shown in FIG. 2.

First, the base wafer 1 with the specific resistance of about 1 kΩ·cm composed of a silicon single crystal is prepared (the step of preparing a base wafer).

Specifically, a silicon single crystal ingot with a specific resistance of about 1 kΩ·cm is grown by using a CZ (Czochralski) method, for example, with a prescribed amount of dopant being introduced into the raw material silicon melt. This silicon single crystal ingot is sliced into a thin disk shape, followed by subjecting to various steps such as chamfering, lapping, etching, and polishing to complete a wafer with a mirror surface (a mirror surface wafer), thereby preparing the base wafer 1 (see FIG. 2 (d)).

In the present invention, the silicon single crystal is grown with a targeted specific resistance of the CZ single crystal being set to about 1 kΩ·cm at this stage, it is markedly easy to control the resistivity compared to the case targeting a specific resistance of more than 4 kΩ·cm, thereby making it possible to improve the yield in producing a silicon single crystal.

In this step, it is preferable to prepare the base wafer 1 with a specific resistance of 4 kΩ·cm or less in order to obtain superior radio-frequency characteristic (a value near 4 kΩ·cm is preferable). Considering the current mass production technology of silicon single crystal, it is relatively easy to produce a silicon single crystal with a specific resistance of 4 kΩ·cm or less. Accordingly, by setting the base wafer 1 to be prepared to have a specific resistance of 4 kΩ·cm or less, it is possible to decrease the production cost for the bonded semiconductor wafer with superior radio-frequency characteristic compared to that of the conventional art.

Then, the carrier trap layer (polycrystalline silicon layer) 2 is formed in a thickness of about 2 μm so as to be in contact with the base wafer 1 (the step of forming a carrier trap layer, see FIG. 2 (e)). The carrier trap layer (polycrystalline silicon layer) 2 is normally formed by using an epitaxial equipment. The form of the epitaxial equipment includes an epi-reactor for depositing a single crystal silicon layer, but polycrystalline silicon, not a single crystal, can be deposited in any equipment by selecting conditions such as lowering of the deposition temperature. Thereafter, the first dielectric layer 3 is formed in a thickness of 400 nm, for example, on the upper surface of the carrier trap layer (polycrystalline silicon layer) 2 by a CVD method or thermal oxidation (the step of forming a first dielectric layer). Subsequently, the polycrystalline silicon layer 4 is formed again by using an epitaxial equipment on the surface of the first dielectric layer 3, and the surface is polished (the step of forming a polycrystalline silicon layer and polishing the surface). The polycrystalline silicon layer 4 may be also deposited in a thickness of about 2 μm, for example. At this stage, the thicknesses of the carrier trap layer (polycrystalline silicon layer) 2 and the polycrystalline silicon layer 4 are not particularly limited. However, since the polycrystalline silicon layer 4 is flattened by polishing the uppermost surface to be a state that can be bonded with the bond wafer 11, too thin layer such as 1 μm or less brings a problem of flatness. Accordingly, the thickness may be set to that value or more (see FIG. 2 (e)).

Concurrently, the bond wafer 11 composed of a silicon single crystal is prepared (the step of preparing a bond wafer), and the second dielectric layer 5 is formed on the bond wafer 11 (the step of forming a second dielectric layer). Specifically, a silicon single crystal wafer is prepared as the bond wafer 11 (see FIG. 2 (a)), for example, and subjected to oxide film growth (e.g., thermal oxidation) to form the dielectric film 12 (see FIG. 2 (b)) to be the second dielectric layer 5 (see FIG. 2 (g)). The thickness of the dielectric film (oxide film) 12 can be several tens nm to several μm, for example.

In addition, hydrogen gas ions or rare gas ions are ion-implanted from above the dielectric film (oxide film) 12 by an ion implantation method to form the ion-implanted layer 13 to be a delaminating plane (see FIG. 2 (c)). In this case, an accelerating voltage of the ion implantation is selected so as to obtain a targeted thickness in the delaminated silicon layer (i.e., the single crystal silicon layer 6, see FIG. 2 (g)).

Then, the base wafer 1 and the bond wafer 11 are bonded such that the polished surface of the polycrystalline silicon layer 4 of the base wafer 1 and the dielectric film (oxide film) 12 of the bond wafer are in contact with each other (the step of bonding a base wafer and a bond wafer, see FIG. 2 (f)).

Subsequently, the bonded bond wafer is thinned to form the single crystal silicon layer 6 (the step of thinning a bond wafer to form a single crystal silicon layer). Specifically, the bonded wafer is subjected to heat treatment to evolve a micro bubble layer in the ion-implanted layer 13 (a delamination heat treatment), for example, and the bond wafer is delaminated along the evolved micro bubble layer to produce the bonded semiconductor wafer 14 in which the second dielectric layer 5 and the single crystal silicon layer 6 are formed on the base wafer 1 (see FIG. 2 (g)). At this stage, the delaminated wafer 17 having the delaminated surface 16 is derived.

As described above, a so-called trap-rich type semiconductor wafer is completed. In the above, either of the (a) to (c) and the (d) to (e) in FIG. 2 can be performed earlier, and the both may be performed simultaneously.

As described above, by manufacturing the bonded semiconductor wafer 14 using the inventive method for manufacturing a bonded semiconductor wafer of Embodiment 1, it is possible to stably provide a bonded semiconductor wafer that shows excellent secondary harmonic wave characteristic and extremely small change of specific resistance of the base wafer in high-temperature heat treatment when it is used as a semiconductor substrate for a radio-frequency integrated circuit.

Embodiment 2

Hereinafter, the inventive bonded semiconductor wafer of Embodiment 2 will be described by reference to FIG. 3. FIG. 3 is a sectional view showing the bonded semiconductor wafer of Embodiment 2 according to the present invention. In the bonded semiconductor wafer 24 shown in FIG. 3, many of the basic structure, properties, and effects are common to those of the inventive bonded semiconductor wafer 14 of Embodiment 1 shown in FIG. 1. Accordingly, the differentiate are described below.

In the bonded semiconductor wafer 24 of Embodiment 2 shown in FIG. 3, the carrier trap layer (ion-implanted layer) 7, which is a damaged layer by using an ion implantation method, is formed at the outermost layer part immediately under the face of the base wafer 1 instead of the carrier trap layer (polycrystalline silicon layer) 2 of the bonded semiconductor wafer 14 of Embodiment 1 shown in FIG. 1.

In the ion implantation method, ions of an atom such as argon, helium, and oxygen are implanted into the base wafer 1, but the same effect can be obtained by implanting ions of another atom. Regarding the act of this carrier trap layer (ion-implanted layer) 7, many defects that are formed on the outermost face part of the base wafer 1 by ion implantation, forming a level to capture free carriers, function as an electron trap, for example, as the act of the carrier trap layer (polycrystalline silicon layer) 2. This brings an effect that the lifetimes of the free carriers are extremely short, and the base wafer 1 is prevented from forming an inversion layer at the main face side, which makes the specific resistance remain unchanged in accordance with potential. As a result, it is possible to maintain the effect that distortion of radio-frequency and crosstalk signals are small, and the radio-frequency characteristic is excellent due to the high specific resistance of the base wafer 1.

As another effect of the carrier trap layer (ion-implanted layer) 7 using an ion implantation method, the process can be simplified, and the bonded semiconductor wafer can be improved in the flatness. That is, since the carrier trap layer (ion-implanted layer) 7 by ion implantation can be formed by ion implantation performed while penetrating the first dielectric layer 3, the polishing amount and time for polishing the polycrystalline silicon layer can be decreased compared to those of the inventive bonded semiconductor wafer 14 of Embodiment 1 shown in FIG. 1, in which the carrier trap layer (polycrystalline silicon layer) 2 and the polycrystalline silicon layer 4 are deposited twice; thereby being excellent in flatness, which is an important point to be determined in bonded semiconductor wafers.

Hereinafter, the inventive method for manufacturing the bonded semiconductor wafer 24 of Embodiment 2 will be described by reference to the sectional production process view shown in FIG. 4. In the sectional process view of FIG. 4 showing the production method of the bonded semiconductor wafer 24 of Embodiment 2 according to the present invention, many parts are common to those in the sectional process view of FIG. 2 showing the production method of the bonded semiconductor wafer 14 of Embodiment 1 according to the present invention. Accordingly, the differentiate are described below.

The base wafer 1 is prepared, and the carrier trap layer (ion-implanted layer) 7, which is a damaged layer formed by using an ion implantation method, is formed at the outermost layer part immediately under the surface of the base wafer 1 as shown in FIG. 4 (*e*) instead of forming the carrier trap layer (polycrystalline silicon layer) 2 of Embodiment 1 as shown in FIG. 2 (*e*) (the step of forming a carrier trap layer). In the ion implantation method, ions of an atom such as argon, helium, and oxygen are implanted into the base wafer 1, but the same effect can be obtained by implanting ions of another atom. This carrier trap layer (ion-implanted layer) 7 is formed such that the base wafer 1 is subjected to thermal oxidation in a prescribed film thickness such as a film thickness of 10 nm or more, preferably 100 nm to 400 nm to form the first dielectric layer 3, and then ion implantation is performed penetrating the first dielectric layer (oxide film) 3 to form the carrier trap layer immediately under the oxide film. After this step, the polycrystalline silicon layer 4 is deposited onto the first dielectric layer 3 with an epitaxial equipment, which step is shown in FIG. 4 (*e*).

Since other steps of the inventive production method of the bonded semiconductor wafer 24 of Embodiment 2 in FIG. 4 are the same with those of the inventive production method of the bonded semiconductor wafer 14 of Embodiment 1 in FIG. 2, the specific explanation will be omitted. By manufacturing through such a flow, it is possible to stably provide a bonded semiconductor wafer that shows excellent secondary harmonic wave characteristic and extremely small change of specific resistance of the base wafer in high-temperature heat treatment when it is used as a semiconductor substrate for a radio-frequency integrated circuit.

Subsequently, regarding a device formed on the bonded semiconductor wafer 14 of Embodiment 1 according to the present invention, a sectional view of an example of the device is shown in FIG. 5.

In FIG. 5, a MOS type transistor is formed on the silicon layer 6 as the active region A by diffusion and so on. The metal electrode M is in ohmic contact with a drain domain and a source domain to pass current between the source S and the drain D. The gate oxide film 10 and the gate G are formed on a channel to control this current.

The active region A is formed on a domain surrounded by the buried gutter 9, and passive elements and other active elements are formed on another device domain B. The structure of the inventive bonded semiconductor wafer 14 of Embodiment 1 can bring remarkably decreased radio-frequency electricity and noise leaked from the active region A to the domain B of other devices, extremely decreased interaction between the devices, and improved yield by performing operation according to the basic design by each device. In addition to that, the base wafer shows extremely small change in specific resistance when high-temperature heat treatment is performed. It is the character of the inventive bonded semiconductor wafer and the production method thereof that such an excellent radio-frequency integrated circuit can be mass-produced stably.

It is to be noted that FIG. 5 shows an example of forming a device by using the inventive bonded semiconductor wafer 14 of Embodiment 1, but the device can be formed by using the inventive bonded semiconductor wafer 24 of Embodiment 2 in the same way, and the same effect can be obtained thereby.

The distribution of specific resistance of bonded semiconductor wafers will be described regarding how the distribution in a depth direction is improved when adopting the structure of the inventive bonded semiconductor wafer 14 of Embodiment 1 by comparing FIG. 6 and FIG. 7.

FIG. 6 is a diagram showing a distribution of specific resistance in a depth direction of the inventive bonded semiconductor wafer 14 of Embodiment 1. FIG. 7 is a diagram showing a distribution of specific resistance in a depth direction of the bonded semiconductor wafer 44 of the conventional example as described above. In the upper part of each graph showing a distribution of specific resistance in a depth direction, simplified sectional view of the bonded semiconductor wafer is shown so as to clearly illustrate the part where the specific resistance is shown in the graph by comparing them.

In FIG. 6, the single crystal silicon layer 6 also has a specific resistance of 10 Ω·cm, and the base wafer 1 also has a specific resistance of 1 kΩ·cm as in the bonded semiconductor wafer of the conventional example in FIG. 7. Each of the carrier trap layer (polycrystalline silicon layer) 2 and the polycrystalline silicon layer 4 deposited by using an epitaxial equipment has a specific resistance of 10 kΩ·cm after the deposition. The first dielectric layer 3 and the second dielectric layer 5 shows very high specific resistance, but each specific resistance is described as 600 kΩ·cm on the graph.

In the inventive bonded semiconductor wafer 14 of Embodiment 1, two substrates are bonded on the bonding plane 18. As described above, the bonding plane 18 can involve unintentional impurities. This reason is specifically considered such that phosphorus atoms or boron atoms, which are diffusion sources of n-type or p-type impurities, can adhere onto the wafer surface in various heat treatments by using an electric furnace; and metallic particles can adhere onto the wafer by mechanical contact as irregularly occurring phenomena.

In the present invention, the second dielectric layer 5 and the first dielectric layer 3 lie on the both sides of the polycrystalline silicon layer 4 and can prevent diffusion of impurities even when such impurities are involved or adhered to the bonding plane 18, thereby confining these unintentional impurities in the interior of the polycrystalline silicon layer 4. As a result, the specific resistance of the base wafer is naturally unchanged, not only is the specific resistance of the carrier trap layer (polycrystalline silicon layer) 2 unchanged. This is a remarkable difference with the conventional example shown in FIG. 7, in which the specific resistance of the base wafer 31 is largely lowered. The polycrystalline silicon layer 4 is sandwiched between the first dielectric layer 3 and the second dielectric layer 5, thereby being extremely difficult to single-crystallize. This is also the reason why the specific resistance of the polycrystalline silicon layer 4 is unchanged. In a polycrystalline silicon layer, decrease of the specific resistance is scarcely observed even when slight impurities have been diffused. The absence of lowering of the specific resistance is equivalent to the maintenance of the excellent radio-frequency characteristic. In the inventive bonded semiconductor wafer 14 of Embodiment 1, excellent radio-frequency characteristic can be realized since the distribution of specific resistance in a depth direction shown in FIG. 6 can be realized, and change and lowering of the specific resistance is extremely small.

It is to be noted that the above has described the distribution of specific resistance in a depth direction of the inventive bonded semiconductor wafer 14 of Embodiment 1, but similar distribution of specific resistance in a depth direction and the same effects can be obtained in the inventive bonded semiconductor wafer 24 of Embodiment 2.

In a radio-frequency integrated circuit formed on the inventive bonded semiconductor wafer in which the circuit is composed of a passive element and an active element, not only a passive element, to handle radio-frequency signals of several GHz used for mobile phones and so on, the radio-frequency is less distorted, signals treated on one circuit is prevented from crosstalk to another neighboring circuit or interfering with signals of another circuit mutually, and each circuit block can be operated as designed.

Specifically, in a bonded semiconductor wafer provided with the base wafer 1 composed of a silicon single crystal, having the first dielectric layer 3, the polycrystalline silicon layer 4, the second dielectric layer 5, and the single crystal silicon layer 6 above the base wafer in this order, with the carrier trap layer (2 or 7) being formed between the base wafer 1 and the first dielectric layer 3; the first dielectric layer 3, being set to 10 nm or more and several μm or less, for example, can prevent the polycrystalline silicon layer 4 from single-crystallization and securely functions as a diffusion barrier to unintentional impurities into the base wafer 1. Immediately under the first dielectric layer 3, the carrier trap layer (2 or 7) lies and functions to trap free carriers to prevent formation of the inversion layer 45. Accordingly, it is possible to provide a bonded semiconductor wafer with excellent radio-frequency characteristic that can be mass-produced at a lower cost with its stable properties and good yield.

EXAMPLE

Hereinafter, the present invention will be more specifically described by showing Examples and Comparative Example, but the present invention is not limited thereto.

Examples 1 and 2

The inventive bonded semiconductor wafers (14 and 24) of Embodiment 1 and Embodiment 2 having structures of FIG. 1 and FIG. 3 were produced under the conditions described in Table 1. Onto each silicon single crystal layer (SOI layer) 6 of the outermost surface, a radio-frequency integrated circuit device was produced.

On each produced device, the secondary harmonic wave characteristic was evaluated. The results are also described in Table 1. It is to be noted that smaller secondary harmonic wave shows superior properties of device. In each bonded semiconductor wafer used for producing the radio-frequency integrated circuit device, the specific resistance was also measured on the face of the base wafer. The results are also described in Table 1.

TABLE 1

| | Example 1 (FIG. 1) | | Example 2 (FIG. 3) | |
|---|---|---|---|---|
| <Structure> | | | | |
| Single crystal Si layer | SOI layer | 160 nm | SOI layer | 160 nm |
| Second dielectric layer | BOX layer | 400 nm | BOX layer | 400 nm |
| Polycrystalline Si layer | Polycrystalline Si layer | 2 μm | Polycrystalline Si layer | 2 μm |
| First dielectric layer | SiO2 layer | 400 nm | SiO2 layer | 200 nm |
| Carrier trap layer | Polycrystalline Si layer | 2 μm | Ion-implanted layer | Ar, 1E16/cm² |
| Base wafer (specific resistance) | 1000 Ω · cm | | 1000 Ω · cm | |
| <Effect> | | | | |
| Secondary harmonic wave | −86 dBm | | −84 dBm | |
| Base wafer face (specific resistance) | 1000 Ω · cm | | 1000 Ω · cm | |

Comparative Example

The bonded semiconductor wafer 44 having the structure of the conventional example shown in FIG. 8 was produced under the conditions shown in Table 2. Onto the silicon single crystal layer (SOI layer) 36 of the outermost surface, a radio-frequency integrated circuit device was produced.

On the produced device, the secondary harmonic wave characteristic was evaluated. The results are also described in Table 2. In the bonded semiconductor wafer used for producing the radio-frequency integrated circuit device, the specific resistance was also measured on the face of the base wafer. The results are also described in Table 2.

TABLE 2

| | Comparative Example (FIG. 8) | |
|---|---|---|
| <Structure> | | |
| Single-crystal Si layer | SOI layer | 160 nm |
| Second dielectric layer | BOX layer | 400 nm |
| Polycrystalline Si layer | Polycrystalline Si layer | 2 μm |
| Dielectric thin film | SiO2 layer | 2 nm |
| Base wafer (specific resistance) | 1000 Ω · cm | |
| <Effect> | | |
| Secondary harmonic wave | −30 dBm | |
| Base wafer face (specific resistance) | 6 Ω · cm | |

In each of the bonded semiconductor wafers of Examples, the face of the base wafer did not show lowering of the specific resistance due to impurities involved in the bonding plane, and superior secondary harmonic wave characteristic was obtained thereby compared to the bonded semiconductor wafer of Comparative Example.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A bonded semiconductor wafer provided with a single crystal silicon layer on a main surface,
    wherein the bonded semiconductor wafer has a base wafer composed of a silicon single crystal, and the bonded semiconductor wafer has a first dielectric layer, a polycrystalline silicon layer, a second dielectric layer, and the single crystal silicon layer above the base wafer in this order, with a bonding plane lying between the polycrystalline silicon layer and the second dielectric layer; and
    wherein a carrier trap layer is formed between the base wafer and the first dielectric layer.

2. The bonded semiconductor wafer according to claim 1, wherein the carrier trap layer is a polycrystalline silicon layer deposited on the base wafer.

3. The bonded semiconductor wafer according to claim 1, wherein the carrier trap layer is an ion-implanted layer formed by ion implantation into the base wafer.

4. The bonded semiconductor wafer according to claim 1, wherein the base wafer has a specific resistance of 4 kΩ·cm or less.

5. The bonded semiconductor wafer according to claim 2, wherein the base wafer has a specific resistance of 4 kΩ·cm or less.

6. The bonded semiconductor wafer according to claim 3, wherein the base wafer has a specific resistance of 4 kΩ·cm or less.

7. A method for manufacturing a bonded semiconductor wafer provided with a single crystal silicon layer on a main surface, comprising the steps of:
    preparing a base wafer composed of a silicon single crystal;
    forming a first dielectric layer above the base wafer;
    forming a polycrystalline silicon layer on the first dielectric layer, and polishing the surface of the polycrystalline silicon layer;
    preparing a bond wafer composed of a silicon single crystal;
    forming a second dielectric layer on a surface of the bond wafer;
    bonding the base wafer and the bond wafer such that the polycrystalline silicon layer of the base wafer and the second dielectric layer of the bond wafer are in contact with each other; and
    thinning the bond wafer to form the single crystal silicon layer; and
    the method further comprising the step of forming a carrier trap layer between the base wafer and the first dielectric layer.

8. The method for manufacturing a bonded semiconductor wafer according to claim 7, wherein the carrier trap layer is formed by depositing the polycrystalline silicon layer on the base wafer.

9. The method for manufacturing a bonded semiconductor wafer according to claim 7, wherein the carrier trap layer is an ion-implanted layer and formed by ion implantation into the base wafer through the first dielectric layer.

10. The method for manufacturing a bonded semiconductor wafer according to claim 7, wherein the prepared base wafer has a specific resistance of 4 kΩ·cm or less.

11. The method for manufacturing a bonded semiconductor wafer according to claim 8, wherein the prepared base wafer has a specific resistance of 4 kΩ·cm or less.

12. The method for manufacturing a bonded semiconductor wafer according to claim 9, wherein the prepared base wafer has a specific resistance of 4 kΩ·cm or less.

* * * * *